United States Patent
Zabolotov et al.

(10) Patent No.: US 10,139,438 B2
(45) Date of Patent: Nov. 27, 2018

(54) APPARATUS AND METHOD FOR CALIBRATING HIGH SPEED SERIAL RECEIVER ANALOG FRONT END AND PHASE DETECTOR

(71) Applicant: Intel Corporation, Santa Clara, CA (US)

(72) Inventors: Gregory Zabolotov, Haifa (IL); Gil Afriat, Givat Ada (IL); Ari Sharon, Kfar Uria (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/247,715

(22) Filed: Aug. 25, 2016

(65) Prior Publication Data

US 2018/0059156 A1   Mar. 1, 2018

(51) Int. Cl.
*G01R 25/00* (2006.01)
*H04B 17/21* (2015.01)
*H04B 17/29* (2015.01)

(52) U.S. Cl.
CPC ............ *G01R 25/00* (2013.01); *H04B 17/21* (2015.01); *H04B 17/29* (2015.01)

(58) Field of Classification Search
None
See application file for complete search history.

(56) References Cited

U.S. PATENT DOCUMENTS

| | | | | |
|---|---|---|---|---|
| 5,974,363 | A * | 10/1999 | Gammel | H04M 3/005 370/241 |
| 7,900,098 | B2 * | 3/2011 | Becker | G06F 11/2733 324/144 |
| 2003/0086505 | A1 | 5/2003 | Nguyen et al. | |
| 2004/0161070 | A1 | 8/2004 | Yin et al. | |
| 2006/0128338 | A1 * | 6/2006 | Kerth | H04B 1/28 455/285 |
| 2007/0230640 | A1 | 10/2007 | Bryan et al. | |
| 2012/0038400 | A1 | 2/2012 | Talaga, Jr. et al. | |
| 2013/0188965 | A1 * | 7/2013 | Afriat | H04B 10/60 398/136 |
| 2013/0230093 | A1 * | 9/2013 | Aziz | H04L 25/03057 375/233 |
| 2014/0266338 | A1 | 9/2014 | Malipatil et al. | |

(Continued)

OTHER PUBLICATIONS

International Search Report and Written Opinion from PCT/US2017/043526 dated Nov. 2, 2017, 17 pgs.

*Primary Examiner* — Jermele M Hollington
*Assistant Examiner* — Douglas X Rodriguez
(74) *Attorney, Agent, or Firm* — Green, Howard & Mughal LLP (57) ABSTRACT

An apparatus is provided which comprises: an amplifier; a first slicer coupled to the amplifier; a de-serializer coupled to an output of the first slicer; a multiplexer which is operable to select one of data or a test signal for the amplifier; a filter coupled to an input of the multiplexer to provide test signal; and a frequency modulator coupled to the filter, wherein the frequency modulator is operable to modulate frequency of the test signal. An apparatus is also provided which comprises: an analog multiplexer having a first input to receive serial data, and a second input; an analog front-end (AFE) coupled to an output of the analog multiplexer; and a filter coupled to the second input of the analog multiplexer.

19 Claims, 6 Drawing Sheets

(56) References Cited

U.S. PATENT DOCUMENTS

2015/0036771 A1\* 2/2015 Li .............................. H04L 1/22
  375/340
2016/0149656 A1  5/2016 Levin et al.
2017/0179999 A1\* 6/2017 Vassiliou ................ H04B 1/56

\* cited by examiner

APPARATUS AND METHOD FOR CALIBRATING HIGH SPEED SERIAL RECEIVER ANALOG FRONT END AND PHASE DETECTOR

BACKGROUND

High speed serial receiver performance is sensitive to unit-to-unit variations in hardly observable receiver parameters such as analog frontend (AFE) transfer function and the phase detector transfer function. Accurate, automatic and quick measurements of these parameters enables performance optimization of the receiver with appropriate automatic calibration. However, performing these measurements is challenging since they are either input data dependent, which requires special test equipment, or extremely high speed signals dependent such as the phase detector response.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Various embodiments disclose an on-die design-for-test (DFT) circuit associated with an analog frontend (AFE) and its' associated circuits in a receiver. In some embodiments, an apparatus (e.g., the AFE, its associated circuits, and the on-die DFT circuit) is provided which comprises: an amplifier (e.g., part of the AFE); a first slicer coupled to the amplifier; and a de-serializer coupled to an output of the first slicer. In some embodiments, the apparatus further comprises a multiplexer (e.g., part of the on-die DFT) which is operable to select one of data or a test signal for the AFE amplifier. In some embodiments, the apparatus comprises a filter coupled to an input of the multiplexer to provide the test signal. In some embodiments, the apparatus comprises a frequency modulator coupled to the filter, wherein the frequency modulator is operable to modulate frequency of the test signal. In some embodiments, the amplifier is coupled to an equalizer, and wherein a combination of the amplifier and the equalizer is coupled to an input of the first slicer. In some embodiments, an output of the de-serializer is received by a pin of a chip. In some embodiments, the frequency modulator comprises a divider. In some embodiments, the filter is a harmonic filter.

In some embodiments, the apparatus comprises a phase interpolator coupled to an input of the frequency modulator, wherein an output of the phase interpolator is coupled to the first slicer. In some embodiments, the apparatus comprises a clock generator to provide a clock to an input of the phase interpolator, wherein the phase interpolator is to vary in delay one or more edges of the clock. In some embodiments, the apparatus comprises a second slicer coupled to the amplifier, wherein the clock is received by the second slicer. In some embodiments, the apparatus comprises a phase detector coupled to an output of the second slicer. In some embodiments, the apparatus comprises a low pass filter coupled to an output of the phase detector and a pin of a chip. In some embodiments, the first and second slicers comprise clock comparators. In some embodiments, the apparatus comprises a reference voltage node which is coupled to the first slicer.

The on-die DFT circuit of various embodiments is practically transparent to the normal operation of receiving and sampling incoming data, but allows for characterizing the transfer functions of the AFE and a phase detector associated with the AFE. As such, the AFE can continues to operate at high frequency allowing the on-die DFT circuit to capture the transfer functions of the AFE and the phase detector with higher accuracy and lower cost than trying to capture transfer functions of the AFE and the phase detector solely using an off-die test equipment. The measurements obtained from the on-die DFT allows for fine tuning the operation of the receiver with high confidence. In some embodiments, the characterization is performed upon a power-on event or in a test mode.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 1:
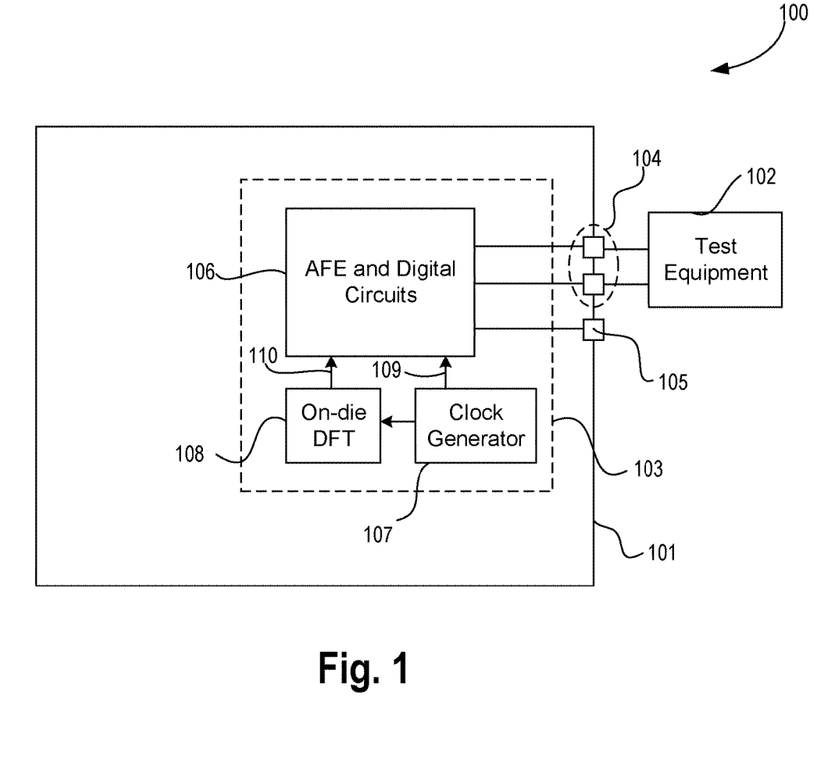
FIG. 1 illustrates an apparatus operable to self-test an analog frontend (AFE) and its associated circuits, according to some embodiments of the disclosure.

FIG. 1 illustrates apparatus 100 operable to self-test an analog frontend (AFE) and its associated circuits, according to some embodiments of the disclosure. In some embodiments, apparatus 100 comprises a processor 101 (e.g., a system-on-chip (SOC), a digital signal processor (DSP), an application specific integrated circuit (ASIC), a field programmable array (FPGA), a memory chip, a general purpose processor, a graphics processor, etc.) and a Test Equipment 102 for post processing the measurements obtained from the processor. In some embodiments, processor 101 comprises a receiver 103, input-output (TO) pins 104 and 105, AFE and its associated digital circuits 106 (also referred to as block 106), clock generator 107, and on-die design-for-test (DFT) circuit 108.

In some embodiments, clock generator 107 provides a clock signal and a phase interpolated clock (together labeled as 109) to AFE and digital circuits 106. In some embodiments, on-die DFT circuit 108 provides frequency modulated test signal 110 to AFE of block 106. In some embodiments, pins 104 provide access to output(s) of a phase detector (e.g., part of block 106). In some embodiments, the phase detector transfer function is as accurate as a delay step of a phase interpolator (PI). As the output of the PI changes, the phase of test signal 110 changes. As the delay steps of the PI are adjusted, the phase detector output changes (because the phase of the test signal 110 changes), and this output is used to determine the transfer function of the phase detector (e.g., part of block 106). By achieving an accurate transfer function of the phase detector, clock data recovery (CDR) loop parameters (e.g., filter coefficients, charge pump current, phase detector gain, etc.) can be optimized per receiver and/or per processor.

In some embodiments, pin 105 is used for receiving regular data (e.g., high speed serial data). In some embodiments, another pin is used to provide serial data which includes transfer function information of the AFE of block 106. In some embodiments, frequency of test signal 110 is modulated by adjusting divider ratios of a clock divider. As the frequency of test signal 110 changes, the amplitude of the AFE in block 106 changes. This change in amplitude is digitized as an output of a de-serializer. The output of the de-serializer is then read from a pin. In some embodiments, test equipment 102 is any equipment that interfaces with pins 104 and other pins (not shown) and analyzes the DFT data and produces the desired transfer function(s).

Figure 2:
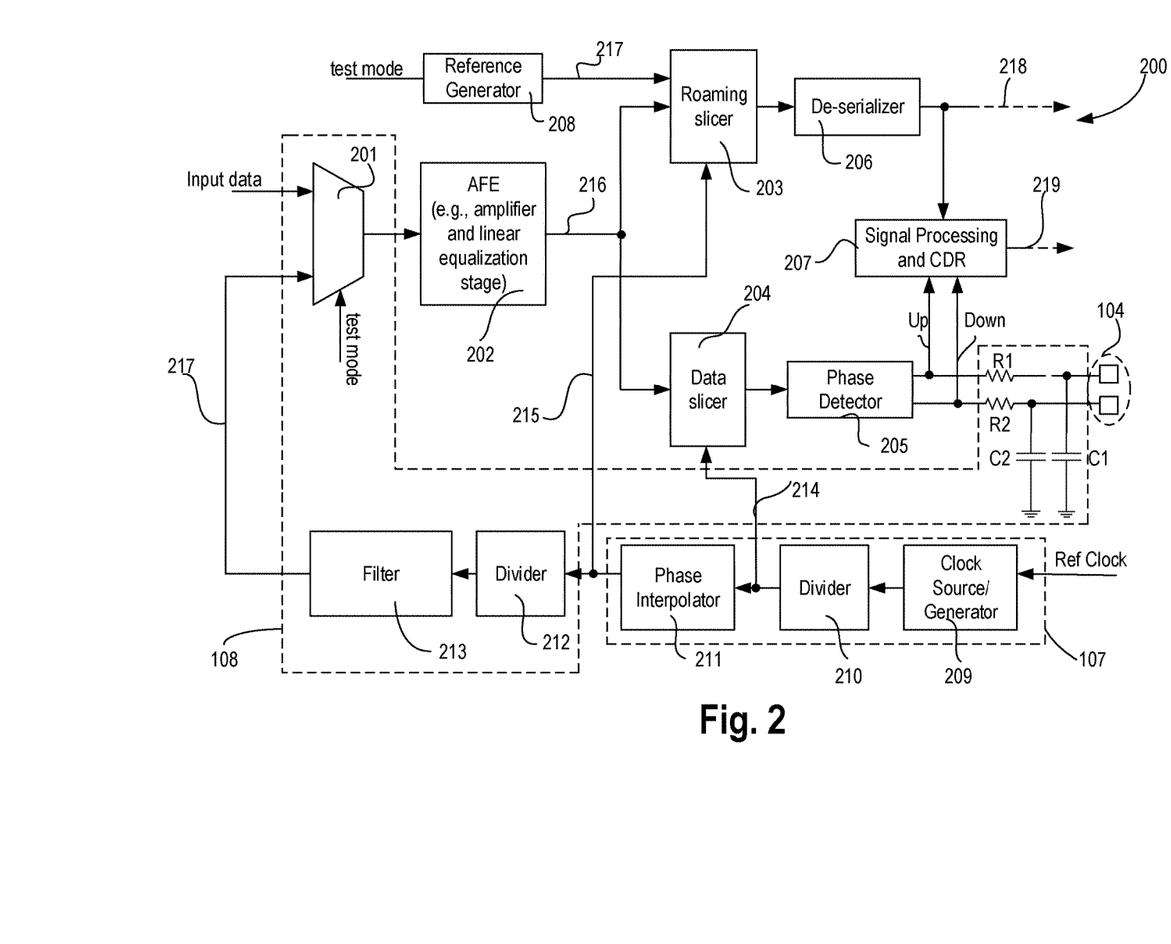
FIG. 2 illustrates an apparatus showing details of an on-die design-for-test (DFT) circuit for characterizing a transfer function of the AFE and for characterizing a transfer function of a phase detector coupled to the AFE, according to some embodiments of the disclosure.

FIG. 2 illustrates apparatus 200 showing details of an on-die DFT circuit for characterizing a transfer function of the AFE and for characterizing a transfer function of a phase detector coupled to the AFE, according to some embodiments of the disclosure. It is pointed out that those elements of FIG. 2 having the same reference numbers (or names) as the elements of any other figure can operate or function in any manner similar to that described, but are not limited to such.

Apparatus 200 (e.g., part of a receiver) comprises multiplexer 201, AFE 202, roaming slicer 203, data slicer 204, phase detector 205, de-serilizer 206, signal processing logic (e.g., CDR) 207, reference generator 208, clock source/generator 209, divider 210, phase interpolator 211, divider 212, filter 213, resistors R1 and R2, and capacitors C1 and C2. As indicated by the dashed lines, DFT circuit 108 may include multiplexer 201, resistors R1 and R2, capacitors C1 and C2, divider 212 and filter 213. As indicated by the dashed lines, clock generator 107 includes clock source/generator 209, divider 210, and phase interpolator 211. These dashed lines are shown for describing the various embodiments, and do not limit certain logics and circuits in certain boxes or boundaries. The circuits can be rearranged in any suitable manner to perform the transfer function characterization with reference to the various embodiments.

In some embodiments, multiplexer 201 is an analog multiplexer. In some embodiments, the analog multiplexer is implemented using pass-gates for transmitting the signal from the input nodes of multiplexer 201 to an output node of multiplexer 201, wherein the pass-gates are controlled by test mode signal and signals derived from the test mode signal (e.g., inverse of the test mode signal). In some embodiments, during normal mode (e.g., in non-test mode), multiplexer 201 selects Input data (e.g., a serial analog data) from a transmitter (not shown) and provides that Input data to AFE 202. In some embodiments, AFE 202 comprises a high speed amplifier which converts the received analog input to a digital output with reference to a reference signal. In some embodiments, AFE 202 also includes a linear equalization stage coupled to an output of an amplifier. Any suitable linear equalizer can be used for implementing the linear equalization stage.

In some embodiments, output 216 of AFE 202 is provided to roaming slicer 203 (also referred to as the first slicer) and data slicer 204 (also referred to as the second slicer). In some embodiments, roaming slicer 203 and data slicer 204 are implemented as clocked comparators and/or flip-flops. In some embodiments, roaming slicer 203 receives a reference voltage 217 via a reference generator 208. The output 216 is compared against reference voltage 217 by roaming slicer 203 to sample data 216. In some embodiments, roaming slicer 203 receives a sampling clock 215 from phase interpolator 211. In some embodiments, the sampling edge of sampling clock 215 is adjusted by phase interpolator 211 to sample data 216 near the center of its eye.

In some embodiments, the output of roaming slicer 203 is a digital output which is input to de-serializer 206 which converts the serial output of roaming slicer 203 into parallel output 218. In some embodiments, output 218 is processed by a signal processing logic 207. In some embodiments, output 218 is also received by a scan chain (or any design for test circuit) to carry that output to an external chip pin for analysis. Output 219 from processing logic 207 can then be used for any purpose.

In some embodiments, data slicer 204 receives clock signal 214 from divider 210. This clock signal 214 samples the incoming data 216 and provides it to phase detector 205. In some embodiments, phase detector 205 is a building block of a clock data recovery (CDR) circuit (e.g., part of block 207) and is used to recover a clock from input data 216. Any suitable high speed phase detector (or phase frequency detector) may be used for implementing phase detector 205. The output of phase detector 205 are Up and Down signals that indicate whether the recovered clock phase and/or frequency needs to be adjusted in one direction or the other (e.g., move phase forward, pull-in phase, increase clock frequency, decrease clock frequency, etc.). Here, reference to signal names and nodes are interchangeably used. For example, the term "Up" may refer to the node Up or the signal Up according to the context of the sentence.

In some embodiments, a filter is coupled to the Up and Down nodes. In some embodiments, the filter comprises resistors R1 and R2, and capacitors C1 and C2. In some embodiments, resistor R1 has one terminal coupled to Up and another terminal coupled to one of the pins 104. In some embodiments, capacitor C1 is coupled to resistor R1 and ground. In some embodiments, resistor R2 has one terminal coupled to Down and another terminal coupled to one of the pins 104. In some embodiments, capacitor C2 is coupled to resistor R2 and ground.

In some embodiments, clock/source generator 209 receives a reference clock (Ref Clk) and generates a high frequency phase locked clock. In some embodiments, clock/source generator 209 is a phase locked loop (PLL). In some embodiments, the output of clock/source generator 209 is divided down by divider 210 that generates clock 214 for data slicer 204 and phase interpolator 211. In some embodiments, frequency of clock 214 can be modulated by adjusting a divider ratio for the divider 210. In some embodiments, divider 210 is implemented as a Johnson Counter. In other embodiments, other types of counters may be used for implementing divider 210.

In some embodiments, clock 214 is received as input to phase interpolator 211 which is operable to adjust or modulate the phase of clock 214. In some embodiments, phase interpolator 211 is implemented as a tree of delay inverters and multiplexers that receive clock 214 and generate clock 215 having a phase different from the phase of clock 214. In some embodiments, phase interpolator 211 is operable to adjust the phase of clock 214 in very fine increments. In some embodiments, phase interpolator 211 is implemented as a current-controlled interpolator. In some embodiments, phase interpolator is a voltage-controlled interpolator. Any suitable circuit for phase interpolation can be used for interpolating the phase of clock 214. In some embodiments, by adjusting the phase of clock 215, the sampling edge of clock 215 is adjusted.

In some embodiments, clock 215 is received by divider 212. In some embodiments, divider 212 generates a clock which has a slower frequency than the frequency of clock 215. In some embodiments, frequency of clock 215 can be modulated by adjusting a divider ratio for the divider 212. In some embodiments, divider 212 is implemented as a Johnson Counter. In other embodiments, other types of counters may be used for implementing divider 212.

In some embodiments, the output of divider 212 is filtered by filter 213. In some embodiments, filter 213 is a harmonic filter implemented using passive devices (e.g., resistor(s) and capacitor(s)). Any suitable arrangement of active and/or passive devices may be used for implementing filter 213. In some embodiments, output 217 (also referred to as test signal 217) of filter 213 is received by multiplexer 201. In some embodiments, during test mode, multiplexer 201 selects test signal 217 and provides it to AFE 202. In some embodiments, during test mode, reference voltage 217 is adjusted.

Figure 3:
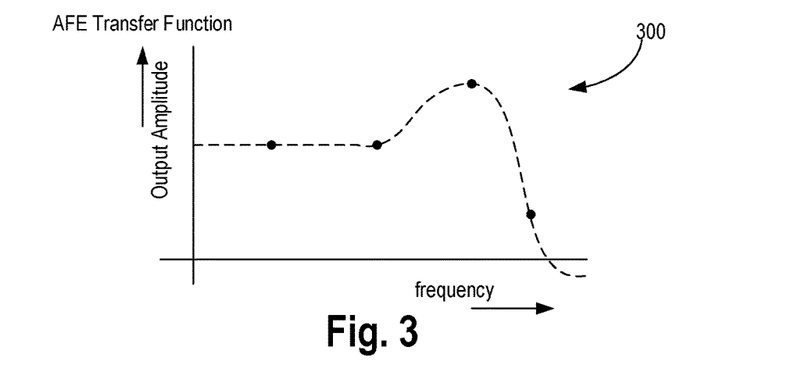
FIG. 3 illustrates a plot showing a transfer function of the AFE obtained using the on-die DFT circuit, according to some embodiments of the disclosure.

In some embodiments, to characterize AFE 202 (e.g., to generate a transfer function of AFE 202), divider ratio of divider 212 is adjusted one ratio at a time and output 218 is monitored. In some embodiments, to characterize AFE 202, phase interpolator 211 provides a set output and frequency of test signal 217 which is then modulated by adjusting frequency clock 215. FIG. 3 illustrates plot 300 showing a transfer function of AFE 202 obtained using the on-die DFT circuit, according to some embodiments of the disclosure. Here, x-axis is frequency (e.g., frequency of test signal 217) and y-axis is the output amplitude of AFE 202 which is extracted from output 218. Here, the various dots on the dotted line are the output amplitudes for different divider ratios of divider 212. A curve can then be formed by connecting the dots to generate the transfer function.

Figure 4:
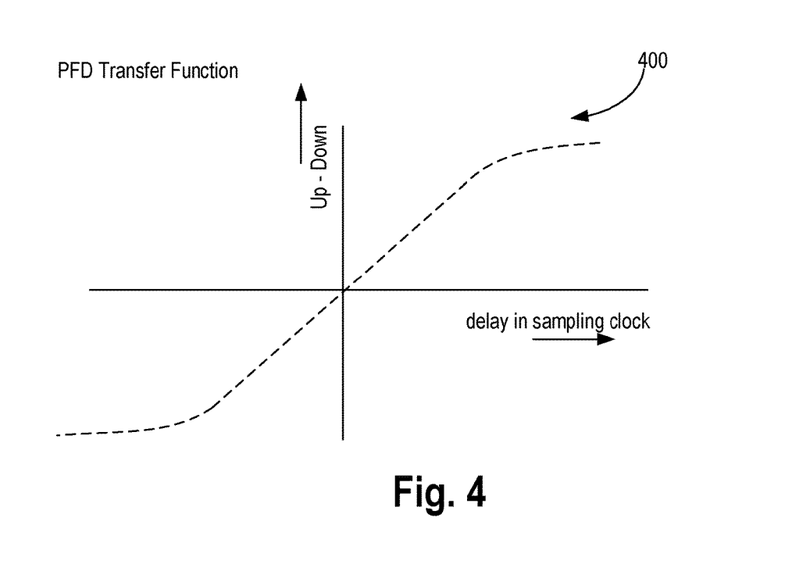
FIG. 4 illustrates a plot showing a transfer function of a phase detector obtained using the on-die DFT circuit, according to some embodiments of the disclosure.

Referring back to FIG. 2, in some embodiments, to characterize phase detector 205, divider ratios of dividers 210 and 212 are fixed and phase of clock 215 is modulated. For example, phase interpolator 211 changes the phase of clock 215 and then signals Up and Down are monitored on pins 104. FIG. 4 illustrates plot 400 showing the transfer function of phase detector 205 obtained using the one-die DFT circuit, according to some embodiments of the disclosure. Here, x-axis is the delay in sampling clock 215 caused by phase interpolator 211, and y-axis is the difference between Up and Down signals as detected on pins 104.

Figure 5:
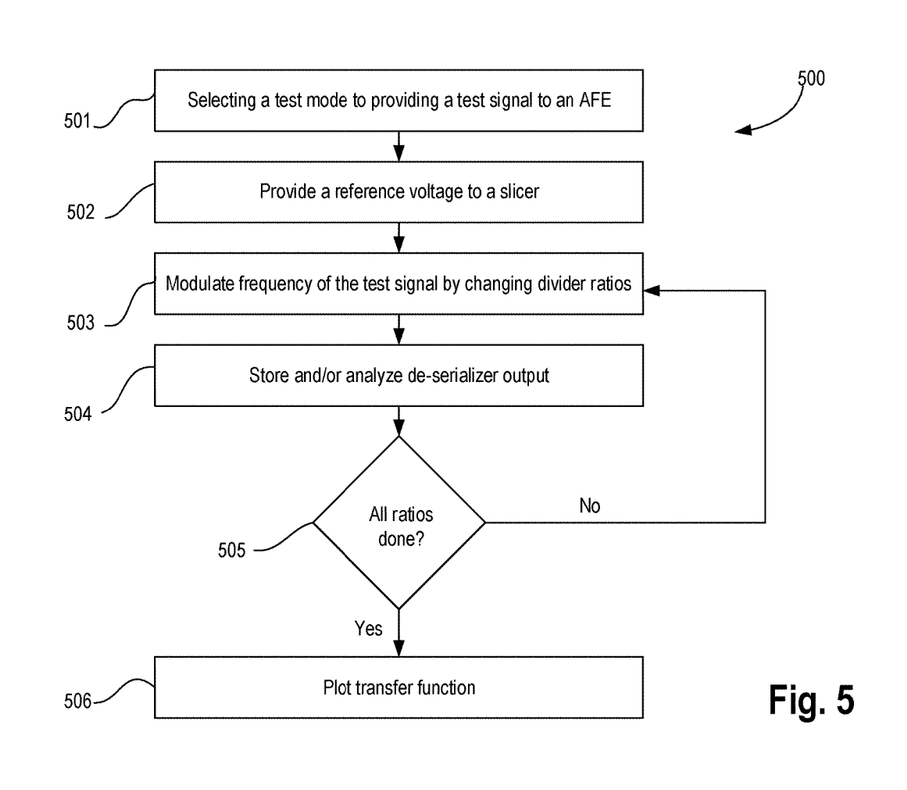
FIG. 5 illustrates a flowchart of a method for obtaining a transfer function of the AFE using the on-die DFT circuit, according to some embodiments of the disclosure.

FIG. 5 illustrates flowchart 500 of a method for obtaining a transfer function of AFE 202 using the on-die DFT circuit, according to some embodiments of the disclosure. It is pointed out that those elements of FIG. 5 having the same reference numbers (or names) as the elements of any other figure can operate or function in any manner similar to that described, but are not limited to such.

At block 501, to enter DFT mode to characterize AFE 202, a test mode is selected in which a test signal is provided to AFE 202 instead of the regular input data. In some embodiments, test mode signal is received by multiplexer 201 which selects the test signal 217 from filter 213 as input of AFE 202. At block 502, reference generator 208 provides reference voltage 217 to roaming slicer 203. In some embodiments, during test mode, reference voltage 217 may be adjusted for characterizing AFE 202. For example, different transfer functions of AFE 202 can be obtained for different reference voltage 217.

At block 503, the frequency of the test signal 217 is modulated (or changed) by changing divider ratios of divider 212. For each frequency change, the output of roaming slicer 203 changes. As such, at block 504, output 218 of de-serializer 206 is stored (e.g., in memory) and then analyzed (e.g., by test equipment 102). In some embodiments, the memory for storing output 218 resides in processor 101. In some embodiments, the memory for storing output 218 is external to processor 101. In some embodiments, the memory for storing output 218 resides in test equipment 102.

At block 505, a determination is made whether all desired frequencies changes have been made to test signal 217. For example, a determination is made whether changes to all divider ratios are complete (e.g., all options or all intended options of divider ratios have been exercised). If a determination is made that more divider ratio changes need to be made to further modulate the frequency of test signal 217, then the process proceeds to block 503. In some examples, for each change in divider ratio, a dot on plot 300 is achieved.

When all desired divider ratios have been exercised, the process proceeds to block 506. At block 506, a transfer function of AFE 202 is plotted. In some embodiments, multiple transfer functions are plotted for different clock phase settings of clock 215 from phase interpolator 211. In some embodiments, multiple transfer functions are plotted for different reference voltage levels of reference voltage 217. As such, AFE 202 is characterized. This characterization can be used to tune various parameters (e.g., reference voltage level of reference voltage 217, amplifier offset of amplifier in AFE 202, sampling edge phase of clock 215) associated with AFE 202.

Figure 6:
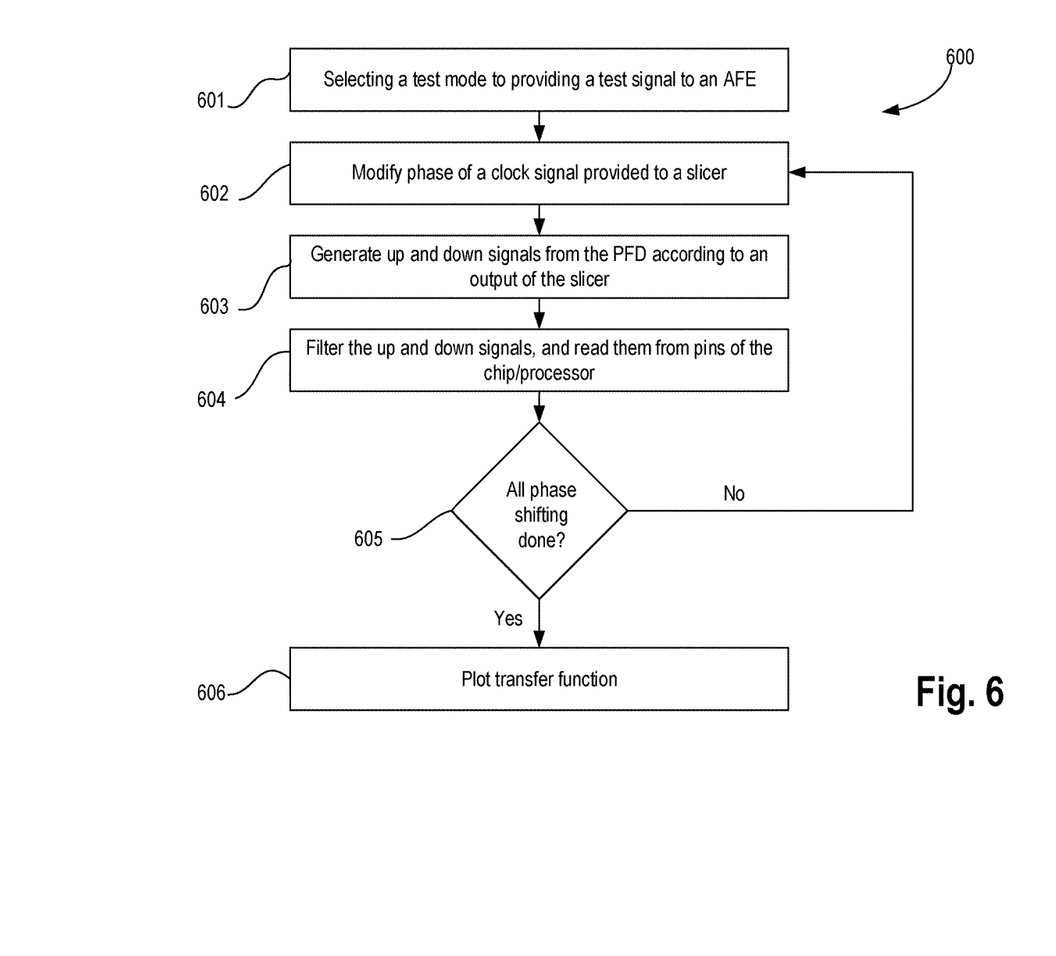
FIG. 6 illustrates a flowchart of a method for obtaining a transfer function of the phase detector coupled to the AFE, according to some embodiments of the disclosure.

FIG. 6 illustrates flowchart 600 of a method for obtaining a transfer function of phase detector 205 coupled to AFE 202, according to some embodiments of the disclosure. It is pointed out that those elements of FIG. 6 having the same reference numbers (or names) as the elements of any other figure can operate or function in any manner similar to that described, but are not limited to such.

At block 601, to enter DFT mode to characterize phase detector 205, a test mode is selected in which a test signal is provided to AFE 202 instead of the regular input data. In some embodiments, test mode is received by multiplexer 201 which selects test signal 217 from filter 213 as input of AFE 202. At block 602, phase interpolator 211 receives input clock 214 adjusts its phase and provides the modified clock 215 to divider 212. In some embodiments, high frequency harmonics are filtered from the output of divider 212 and a filtered test signal 217 is provided to multiplexer 201.

At block 603, phase detector 205 generates Up and Down signals according to the output of data slicer 204. For each change in phase of clock 215, Up and Down signals change. At block 604, Up and Down signals are filtered by resistors R1 and R2, and capacitors C1 and C2. The filtered Up and Down signals are read at pins 104. In some embodiments, test equipment 102 stores the data read from pins 104.

At block 605, a determination is made whether all desired phase shifting by phase interpolator 211 have been done. If more phase changes to clock 215 are to be made, the process proceeds to block 602, otherwise the process proceeds to block 606. At block 606, plot 400 is plotted and characteristics of phase detector 205 are analyzed. In some embodiments, the transfer function of phase detector 205 can be used for tuning CDR parameters (e.g., charge pump current, loop filter capacitance, etc.). In some embodiments, a product of a gain of phase detector 205 (e.g., slope of plot 400) and charge pump current (Icp) divided by loop filter capacitance is desired to be constant to achieve a constant response. If the gain of phase detector 205 is greater than expected, then that information can be used to reduce charge pump current (Icp). Likewise, if the gain of phase detector 205 is less than expected, then that information can be used to increase charge pump current (Icp). As such, performance of CDR 207 can be improved.

In some embodiments, the operations of DFT circuit (e.g., operations of characterizing AFE 106) is controlled or managed by a finite state machine (FSM). In some embodiments, the flowcharts of FIGS. 5-6 are controlled by a finite state machine and/or software (e.g., operating system).

Although the blocks with reference to FIGS. 5-6 are shown in a particular order, the order of the actions can be modified. Thus, the illustrated embodiments can be performed in a different order, and some actions/blocks may be performed in parallel. Some of the blocks listed in FIGS. 5-6 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Figure 7:
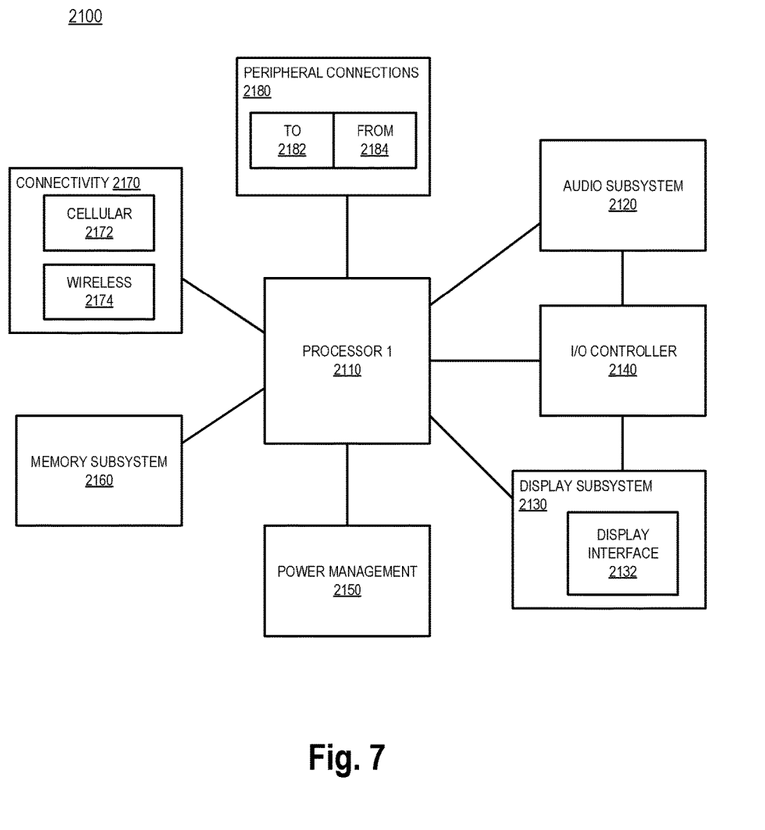
FIG. 7 illustrates a smart device or a computer system or a SoC (System-on-Chip) with on-die DFT circuit for obtaining transfer functions of the AFE and the phase detector, in accordance with some embodiments.

FIG. 7 illustrates a smart device or a computer system or a SoC (System-on-Chip) with on-die DFT circuit for obtaining transfer functions of the AFE and the phase detector, in accordance with some embodiments. It is pointed out that those elements of FIG. 7 having the same reference numbers (or names) as the elements of any other figure can operate or function in any manner similar to that described, but are not limited to such.

FIG. 7 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with an on-die DFT circuit for obtaining transfer functions of an AFE and a phase detector, according to some embodiments discussed. Other blocks of the computing device 2100 may also include an on-die DFT circuit for obtaining transfer functions of an AFE and a phase detector according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: an amplifier; a first slicer coupled to the amplifier; a de-serializer coupled to an output of the first slicer; a multiplexer which is operable to select one of data or a test signal for the amplifier; a filter coupled to an input of the multiplexer to provide the test signal; and a frequency modulator coupled to the filter, wherein the frequency modulator is operable to modulate frequency of the test signal. In some embodiments, the amplifier is coupled to an equalizer, and wherein a combination of the amplifier and the equalizer is coupled to an input of the first slicer. In some embodiments, an output of the de-serializer is received by a pin of a chip. In some embodiments, the frequency modulator comprises a divider. In some embodiments, the filter is a harmonic filter.

In some embodiments, the apparatus comprises: a phase interpolator coupled to an input of the frequency modulator, wherein an output of the phase interpolator is coupled to the first slicer. In some embodiments, the apparatus comprises a clock generator to provide a clock to an input of the phase interpolator, wherein the phase interpolator is to vary in delay one or more edges of the clock. In some embodiments, the apparatus comprises a second slicer coupled to the amplifier, wherein the clock is received by the second slicer. In some embodiments, the apparatus comprises a phase detector coupled to an output of the second slicer. In some embodiments, the apparatus comprises a low pass filter coupled to an output of the phase detector and a pin of a chip. In some embodiments, the first and second slicers comprise clock comparators. In some embodiments, the apparatus comprises a reference voltage node which is coupled to the first slicer.

In another example, a system is provided which comprises: a memory; a processor coupled to the memory, the processor having a receiver which comprises an apparatus according to the apparatus described above; and a wireless interface for allowing the processor to communicate with another device.

In another example, an apparatus is provided which comprises: an analog multiplexer having a first input to receive serial data, and a second input to receive a test signal; an analog front-end (AFE) coupled to an output of the analog multiplexer; and a filter coupled to the second input of the analog multiplexer, wherein the filter is to filter harmonics in the test signal. In some embodiments, the apparatus comprises a frequency modulator coupled to the filter, wherein the frequency modulator is to modulate a frequency of the test signal. In some embodiments, the apparatus comprises a phase interpolator coupled to an input of the frequency modulator.

In some embodiments, the apparatus comprises: a clock generator to provide a clock to the phase interpolator, wherein the phase interpolator is to vary in delay one or more edges of the clock. In some embodiments, the apparatus comprises: a first slicer including a clock node coupled to an output of the phase interpolator, a data node coupled to an output of the AFE, a reference node to receive a reference voltage; and an output; and a de-serializer coupled to the output of the first slicer. In some embodiments, the apparatus comprises: a second slicer including a data node coupled to an output of the AFE, and a clock node to receive the clock; a phase detector coupled to an output of the second slicer; and a low pass filter coupled to an output of the phase detector, wherein an output of the low pass filter is coupled to at least one pin of a chip.

In another example, a system is provided which comprises: a memory; a processor coupled to the memory, the processor having a receiver which comprises an apparatus according to the apparatus described above; and a wireless interface for allowing the processor to communicate with another device. In some embodiments, an output of the de-serializer is received by a pin of a chip.

In another example, a method for characterizing a transfer function is provided, wherein the method comprises: selecting a test mode to provide a test signal to an analog frontend (AFE); providing a reference voltage to a slicer coupled to the AFE; modulating frequency of the test signal by changing divider ratios; and for every change in divider ratio, store an output of a de-serializer coupled to the slicer. In some embodiments, the method comprises: providing a clock to the slicer. In some embodiments, the method comprises: filtering the test signal in response to changing the divider ratio.

In another example, a method is provided which comprises: selecting a test mode to provide a test signal to an analog frontend (AFE); modifying phase of a clock signal provided to a slicer coupled to the AFE; generating up and down signals according to an output of the slicer; and filtering the up and down signals. In some embodiments, the method comprises: dividing a frequency of the clock signal to generate of modulated clock signal; filtering the modulated clock signal and providing the filtered modulated clock signal as the test signal.

In another example, an apparatus is provided which comprises: means for means for selecting a test mode to provide a test signal to an analog frontend (AFE); means for means for providing a reference voltage to a slicer coupled to the AFE; means for modulating frequency of the test signal by changing divider ratios; and for every change in divider ratio, means for storing an output of a de-serializer coupled to the slicer. In some embodiments, the apparatus comprises means for providing a clock to the slicer. In some embodiments, the apparatus comprises means for filtering the test signal in response to changing the divider ratio.

In another example, a system is provided which comprises: a memory; a processor coupled to the memory, the processor having a receiver which comprises an apparatus according to the apparatus described above; and a wireless interface for allowing the processor to communicate with another device.

In another example, an apparatus is provided which comprises: means for selecting a test mode to provide a test signal to an analog frontend (AFE); means for modifying phase of a clock signal provided to a slicer coupled to the AFE; means for generating up and down signals according to an output of the slicer; and means for filtering the up and down signals. In some embodiments, the apparatus comprises: means for dividing a frequency of the clock signal to generate of modulated clock signal; and means for filtering the modulated clock signal and means for providing the filtered modulated clock signal as the test signal.

In another example, a system is provided which comprises: a memory; a processor coupled to the memory, the processor having a receiver which comprises an apparatus according to the apparatus described above; and a wireless interface for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   an amplifier;
   a first slicer coupled to the amplifier;
   a de-serializer coupled to an output of the first slicer;
   a multiplexer which is operable to select one of data or a test signal for the amplifier;
   a filter coupled to an input of the multiplexer to provide the test signal; and
   a frequency modulator coupled to an input of the filter, wherein the frequency modulator is operable to modulate frequency of the test signal, and wherein the frequency modulator comprises a divider.

2. The apparatus of claim 1, wherein the amplifier is coupled to an equalizer, and wherein a combination of the amplifier and the equalizer is coupled to an input of the first slicer.

3. The apparatus of claim 1, wherein an output of the de-serializer is received by a pin of a chip.

4. The apparatus of claim 1, wherein the filter is a harmonic filter.

5. The apparatus of claim 1 comprises a phase interpolator coupled to an input of the frequency modulator, wherein an output of the phase interpolator is coupled to the first slicer.

6. The apparatus of claim 5 comprises a clock generator to provide a clock to an input of the phase interpolator, wherein the phase interpolator is to vary in delay one or more edges of the clock.

7. The apparatus of claim 6 comprises a second slicer coupled to the amplifier, wherein the clock is received by the second slicer.

8. The apparatus of claim 7 comprises a phase detector coupled to an output of the second slicer.

9. The apparatus of claim 8 comprises a low pass filter coupled to an output of the phase detector and a pin of a chip.

10. The apparatus of claim 6, wherein the first and second slicers comprise clock comparators.

11. The apparatus of claim 1 comprises a reference voltage node which is coupled to the first slicer.

12. An apparatus comprising:
    an analog multiplexer having a first input to receive serial data, and a second input to receive a test signal;
    an analog front-end (AFE) directly coupled to an output of the analog multiplexer; and
    a filter coupled to the second input of the analog multiplexer, wherein the filter is to filter harmonics in the test signal.

13. The apparatus of claim 12 comprises a frequency modulator coupled to the filter, wherein the frequency modulator is to modulate a frequency of the test signal.

14. The apparatus of claim 13 comprises a phase interpolator coupled to an input of the frequency modulator.

15. The apparatus of claim 14 comprises a clock generator to provide a clock to the phase interpolator, wherein the phase interpolator is to vary in delay one or more edges of the clock.

16. The apparatus of claim 15 comprises:
    a first slicer including:
      a clock node coupled to an output of the phase interpolator,
      a data node coupled to an output of the AFE,
      a reference node to receive a reference voltage; and
      an output; and
    a de-serializer coupled to the output of the first slicer.

17. The apparatus of claim 16 comprises:
    a second slicer including a data node coupled to an output of the AFE, and a clock node to receive the clock;
    a phase detector coupled to an output of the second slicer; and
    a low pass filter coupled to an output of the phase detector, wherein an output of the low pass filter is coupled to at least one pin of a chip.

18. A system comprising:
a memory;
a processor coupled to the memory, the processor having
a receiver which comprises:
an amplifier;
a first slicer coupled to the amplifier;
a de-serializer coupled to an output of the first slicer;
a multiplexer which is operable to select one of data or a test signal for the amplifier;
a filter coupled to an input of the multiplexer to provide test signal; and
a frequency modulator coupled to an input of the filter, wherein the
frequency modulator is operable to modulate frequency of the test signal, and
wherein the frequency modulator comprises a divider; and
a wireless interface to allow the processor to communicate with another device.

19. The system of claim 18, wherein an output of the de-serializer is received by a pin of a chip.

* * * * *